United States Patent [19]

Kusakabe et al.

[11] Patent Number: 4,492,926
[45] Date of Patent: Jan. 8, 1985

[54] AMPLITUDE MODULATION DETECTOR

[75] Inventors: Hiromi Kusakabe; Atsushi Ogawa, both of Yokohama, Japan

[73] Assignee: Tokyo Shibaura Denki Kabushiki Kaisha, Japan

[21] Appl. No.: 292,263

[22] Filed: Aug. 12, 1981

[30] Foreign Application Priority Data

Aug. 14, 1980 [JP] Japan .............................. 55-112074

[51] Int. Cl.³ .......................... H03D 1/10; H03D 1/06
[52] U.S. Cl. ............................... 329/205 R; 307/264; 329/179; 330/278; 330/280
[58] Field of Search ........... 329/169, 179, 203, 205 R, 329/206; 330/138, 278, 280; 307/350, 359, 264; 455/337; 328/173, 175

[56] References Cited

U.S. PATENT DOCUMENTS

| 2,773,945 | 12/1956 | Theriault | 329/205 R |
| 2,983,815 | 5/1961 | Guyton et al. | 329/205 R |
| 3,691,465 | 9/1972 | McFadyen | 329/203 |

FOREIGN PATENT DOCUMENTS

| 310827 | 10/1973 | Fed. Rep. of Germany . |
| 2333118 | 1/1975 | Fed. Rep. of Germany . |
| 2422534 | 12/1975 | Fed. Rep. of Germany . |
| 818877 | 8/1959 | United Kingdom . |
| 876042 | 8/1961 | United Kingdom . |
| 1013545 | 12/1965 | United Kingdom . |
| 1492814 | 11/1977 | United Kingdom . |
| 1502253 | 3/1978 | United Kingdom . |
| 1512953 | 6/1978 | United Kingdom . |

Primary Examiner—John Zazworsky
Attorney, Agent, or Firm—Finnegan, Henderson, Farabow, Garrett & Dunner

[57] ABSTRACT

The amplitude modulation detection device, which is provided with an AM (amplitude modulation) responsive to first and second input signals for maintaining a constant D.C. level output signal, the first signal being the AM signal, and the second signal produced by feedback loop which includes a D.C. voltage comparator connected to the detector for comparing the D.C. output level of the detector with a reference signal level.

4 Claims, 6 Drawing Figures

AMPLITUDE MODULATION DETECTOR

FIELD OF THE INVENTION

This invention relates to an amplitude modulation detector, and more particularly, to an amplitude modulation detector whose D.C. output component is constant.

BACKGROUND OF THE INVENTION

It is desirable for an amplitude modulation detector to produce an output whose D.C. voltage component is always constant. This simplifies the design of the audio frequency amplifier (AF amplifier), and also eliminates noise arising at the time of switching frequency bands or switching to or from other sources. Such sources can be, for instance, a frequency modulation detector or tape player combined with the amplitude modulation detector in a set. The noise is caused by a sudden change of the D.C. voltage component of the input signal to the AF amplifier.

Conventional amplitude modulation (AM) radio receivers have needed AF amplifiers having wide level response to the input signal from the amplitude modulation detectors. Moreover, multiband type conventional AM receivers or combination sets with an AM receiver section and other signal source section, such as a tape recorder, have used decoupling capacitors connected before the AF amplifiers.

However, the decoupling capacitors are difficult to fabricate when using integrated circuits (IC circuits).

SUMMARY OF THE INVENTION

It is, therefore, an object of the present invention to provide an AM detector producing an output whose D.C. component is constant.

Another object of the present invention is to provide an AM detector which can be directly connected to an amplifier section without a decoupling capacitor.

According to the present invention, the AM detector is provided with (a) AM detection means responsive to first and second input signals for maintaining a constant D.C. level output signal, the first signal being the AM signal, and (b) feedback means connected to the output of the detection means for comparing the D.C. output level of the detection means with a reference signal level to produce the second signal.

Additional objects and advantages of the present invention will become apparent to persons skilled in the art from a study of the following description of the accompanying drawings.

DESCRIPTION OF THE PREFERRED EMBODIMENT

Figure 1:
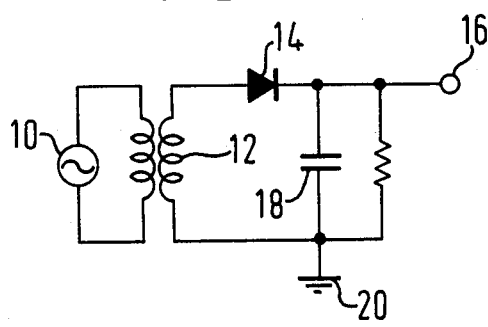
FIG. 1 shows an amplitude modulation detector of the prior art.

The present invention will be described in detail with reference to the accompanying drawings FIG. 1 to FIG. 6. Throughout the drawings, like reference numerals will be used to designate like or equivalent elements.

The prior art to which this invention is an improvement includes an input signal source 10 such as an IF amplifier, a coupling transformer 12 and a detection diode 14. An AM signal $S_{in}$ is applied from input signal source 10 to detection diode 14 through coupling transformer 12. The AM signal is composed of an intermediate frequency signal (IF signal) modulated by an audio frequency signal (AF signal). The AM signal is detected by detection diode 14 so that a rectified signal of the AM signal appears on output terminal 16 connected to detection diode 14. An IF frequency component included in the rectified signal is bypassed through capacitor 18 connected between output terminal 16 and reference potential terminal 20 so that an output on output terminal 16 is a signal composed of the AF signal component and a D.C. component.

Figure 2:
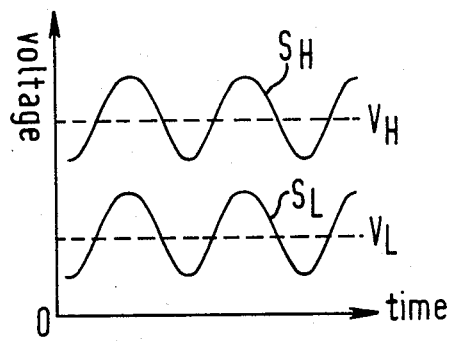
FIG. 2 is a graph showing the output signals of the amplitude modulation detector shown in FIG. 1.

In FIG. 2, the output signal is typically shown by the waveform $S_L$ representing a low level condition or by the waveform $S_H$ representing a high level condition. The level condition of the output signal varies in accordance with the amplitude level of the IF signal. Low level output signal $S_L$ is composed of the AF signal denoted by $S_A$ and a D.C. component by $V_L$ where $S_L = S_A + V_L$. On the other hand, high level output signal $S_H$ is composed of AF signal $S_A$ and another D.C. component denoted by $V_H$ where $S_H = S_A + V_H$.

The AM detector shown in FIG. 1 has several limitations as described below. First, detection diode 14 is required to have good linearity of its forward input voltage-output current characteristics. Otherwise the output signal will be distorted when the AM signal is relatively large. Secondly, an AF amplifier which follows the AM detector must have a large input capacity, or otherwise be connected to the AM detector through a decoupling capacitor which is difficult using IC circuitry.

Figure 3:
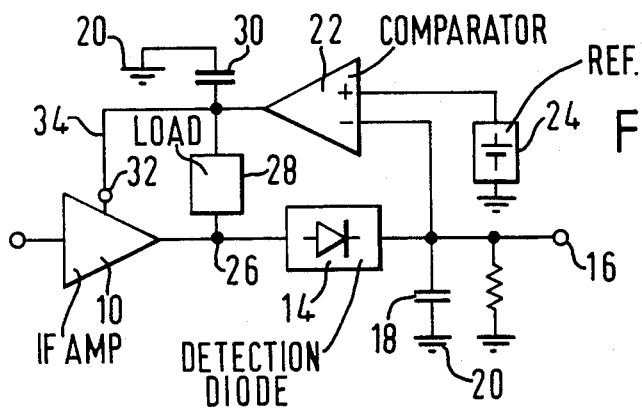
FIG. 3 shows a block diagram of an amplitude modulation detector according to the present invention.

Referring now to FIG. 3, there is shown a block diagram of an AM detector of one embodiment of the present invention, which comprises input signal source 10, detection diode 14 and D.C. voltage comparator 22. The input signal source, which can be for example an IF amplifier 10, is connected to the anode of detection diode 14. The cathode of detection diode 14 is not only connected to output terminal 16, but also to one input of a D.C. voltage comparator, such as a D.C. amplifier 22. A second input of D.C. amplifier 22 is connected to reference voltage source 24. The output of D.C. amplifier 22 is connected through load impedance 28 to amplifier 10 and detection diode 14.

Figure 4:
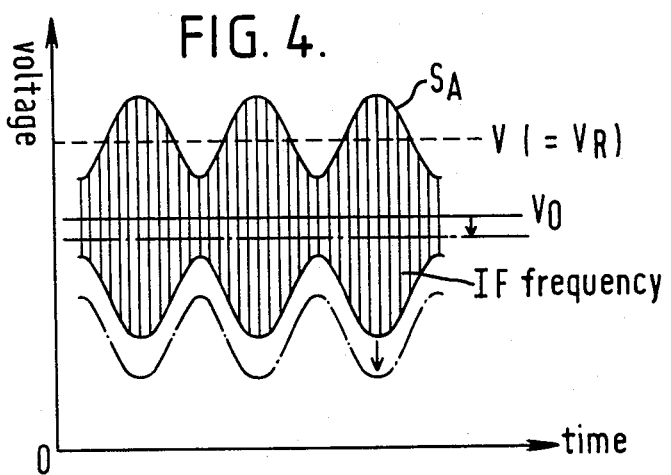
FIG. 4 is a graph showing input and output signals of the amplitude modulation detector shown in FIG. 3.

The AM signal with IF frequency is applied from IF amplifier 10 to detection diode 14 so that the rectified signal of the AM signal appears on output terminal 16. An IF frequency component in the rectified signal is bypassed through capacitor 18 connected between the cathode of detection diode 14 and reference potential terminal 20. The output signal on output terminal 16 is composed of AF signal component $S_A$ and D.C. component V, as shown in FIG. 4. D.C. component V is applied to D.C. amplifier 22 and compared with reference voltage $V_R$ of reference voltage source 24. D.C. amplifier 22 gives a D.C. output $V_O$ which depends on the difference voltage between reference voltage $V_R$ and D.C. component V of the rectified signal. Any component of AF frequency leaking to the output of D.C. amplifier 22 is bypassed through capacitor 30 connected between the output of D.C. amplifier 22 and reference potential terminal 20. Accordingly, the combined AM signal and D.C. output $V_O$ are applied to detection diode 14. Therefore, D.C. component V is a voltage composed of the rectified voltage of the AM signal itself and D.C. output $V_O$.

When the AM signal level varies, D.C. component V will vary. D.C. output $V_O$ of D.C. amplifier 22 will vary with changes in the D.C. component V but oppositely to it. Thus, when the level of the AM signal increases, the D.C. voltage level at node 26 is lowered because D.C. output $V_O$ decreases in direct relation with the increase of D.C. component V. Accordingly, D.C. output $V_O$ operates to minimize the change of D.C. component V. As a result, D.C. component V is held at the value of reference voltage $V_R$ in spite of level changes of the AM signal. Therefore, the output signal of detection diode 14 always is a constant D.C. component V held sustantially equal to the reference voltage $V_R$. D.C. output $V_O$ of D.C. amplifier 22 is applied to the automatic gain control (AGC) terminal 32 of IF amplifier 10 to control the level of the IF signal in correspondence with the change of D.C. output $V_O$.

The suppression rate of change K of the D.C. component is a function of loop gain G of the negative feedback (NF) loop comprised of detection diode 14 and D.C. amplifier 22, and represented as follows:

$$K = 1/G$$

The loop gain G is a function of transfer conductance gm of D.C. amplifier 22, and is represented as follows:

$$G = gm \frac{Z_o \cdot Z_i}{Z_o + Z_i}$$

where Zo is an output impedance of IF amplifier 10, and Zi is the input impedance of detection diode 14.

Therefore, the suppression rate K is given by the following equation:

$$K = 1/G = \frac{1}{gm} \cdot \frac{Z_o + Z_i}{Z_o \cdot Z_i}$$

It is best to keep the suppression rate K as small as possible, but an excessively small rate K causes the loop to oscillate badly. Therefore the preferred value for rate K is in the range of 1/10 to 1/100, or 20 dB to 40 dB.

Figure 5:
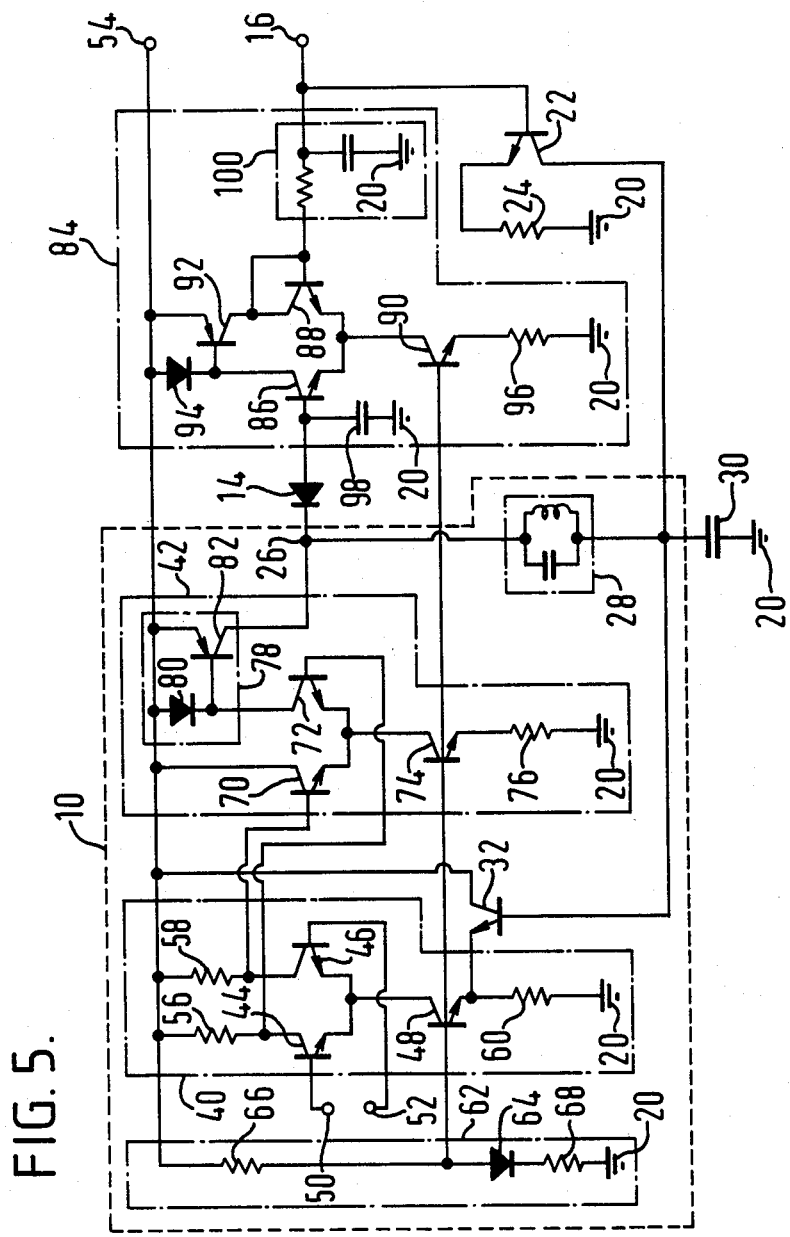
FIG. 5 shows a detailed circuit diagram of the amplitude modulation detector shown in FIG. 3.

Referring now to FIG. 5, there is shown a detailed circuit diagram of a preferred embodiment of the AM detector. IF amplifier 10 is constituted by two differential amplifiers 40 and 42. First differential amplifier 40 includes three NPN transistors 44, 46 and 48, transistors 44 and 46 being coupled at their emitters to one another and transistor 48 in turn being coupled at its collector to the emitters of transistors 44 and 46. Transistors 44 and 46 are connected at their bases to input terminals 50 and 52 adapted for connection to an IF convertor (not shown), and at their collectors to positive voltage source terminal 54 via resistance loads 56 and 58 respectively. Transistor 48 is connected at its emitter to reference potential terminal 20 via resistor 60 and at its base to a voltage supply circuit 62. The voltage supply circuit 62, which supplies a constant voltage, includes diode 64 which connects at its anode to positive voltage source terminal 54 through resistor 66 and at its cathode to reference potential terminal 20 through resistor 68.

Second differential amplifier 42 also includes three NPN transistors 70, 72 and 74, transistors 70 and 72 being coupled at their emitters to one another and transistor 74 being coupled at its collector to the emitters of transistors 70 and 72. Transistors 70 and 72 are connected at their bases to first differential amplifier 40 at the respective collectors of transistors 44 and 46, and at their collectors to positive voltage source terminal 54. Transistor 70 is directly coupled to source 54 and transistor 72 is connected through current mirror circuit 78. Transistor 74 is connected at its emitter to reference potential terminal 20 via resistor 76 and at its base to voltage supply circuit 62.

Current mirror circuit 78 includes diode 80 connected in forward bias relationship between the collector of transistor 72 and positive voltage source terminal 54. PNP transistor 82 is connected having its emitter-base path in parallel with diode 80. The collector of transistor 82 forms an output terminal of IF amplifier 10.

Detection diode 14 is connected to IF amplifier 10. Detection diode 14 is connected at its cathode to the collector of transistor 82 and at its anode to output terminal 16 through buffer amplifier 84.

Buffer amplifier 84 includes NPN transistors 86, 88 and 90, PNP transistor 92 and diode 94. Two NPN transistors 86 and 88 are connected at their bases respectively to detection diode 14 and output terminal 16 and connected to each other in a differential amplifier arrangement. Another NPN transistor 90 is connected at its collector to the emitters of transistors 86 and 88, at its emitter to reference potential terminal 20 through resistor 96, and at its base to voltage supply circuit 62. Diode 94 and PNP transistor 92 are connected to each other in a current mirror circuit. The base of transistor 86 is connected to reference potential terminal 20 through capacitor 98. The base of transistor 88 is coupled to its collector and connected to output terminal 16 via low pass filter 100.

Output terminal 16 is connected to the base of NPN transistor 22 which operates as a D.C. voltage comparator. Transistor 22 is connected at its emitter to reference potential terminal 20 through resistor 24 as a reference voltage source. The collector of transistor 22 is connected to node 26 between IF amplifier 10 and detection diode 14. LC tank circuit 28, which is the load for the second differential amplifier 42 of IF amplifier 10, is connected to reference potential terminal 20 through capacitor 30. The collector of transistor 22 is further connected to the base of NPN transistor 32 as an AGC circuit for IF amplifier 10. Transistor 32 is connected at its emitter to the emitter of transistor 60 in first differential amplifier 40.

The operation of the AM detector shown in FIG. 5 is described as follows. An IF signal, converted from an RF signal, is applied across input terminals 50 and 52, and amplified by first and second differential amplifiers 40 and 42. Then, the amplified IF signal is applied to detection diode 14 and rectified by detection diode 14. An audio frequency (AF) signal component as an envelope of negative half cycles of the IF signal appears on the anode of detection diode 14, but the IF frequency component of rectified IF signal is filtered by capacitor 98. The AF signal is brought to output terminal 16 after being amplified by buffer amplifier 84 and any IF frequency component is filtered by low pass filter 100.

An output signal on output terminal 16 is applied to and processed by the D.C. voltage comparator, transistor 22. That is, the base of transistor 22 is connected to output terminal 16 the output signal. The output signal is compared with its emitter potential generated by a voltage drop across resistor 24. An amplified AF signal component on the collector of transistor 22 is filtered by capacitor 30. Therefore, a collector potential, referred to the difference between the emitter potential and the base potential, is applied to connection node 26 between IF amplifier 10 and detection diode 14 through LC tank circuit 28. As a result, the D.C. voltage component of the output signal on output terminal 16 is controlled at a constant voltage level by the effect of negative feedback through transistor 22.

The constant D.C. voltage $V_C$ is obtained by the following equation:

$$V_C = I_{22} \cdot R_{24} + V_{BE22} \quad (1)$$

where $I_{22}$ is a D.C. current through transistor 22, $R_{24}$ is a resistance of resistor 24 and $V_{BE22}$ is a base-emitter voltage of transistor 22. D.C. current $I_{22}$ is equal to the D.C. current through diode 80 or transistor 72 of second differential amplifier 42. D.C. currents through transistors 70 and 72 are equal to each other and both are supplied from transistor 74. Therefore, D.C. current $I_{22}$ is expressed as follows, in terms of D.C. current $I_{74}$ through transistor 74, $$I_{22} = I_{74}/2$$

Accordingly, the equation (1) is rewritten as follows, $$V_C = \frac{I_{74} \cdot R_{24}}{2} + V_{BE22} \quad (2)$$

D.C. current $I_{74}$ may be set constant since transistor 74 operates as a constant current source circuit. Base-emitter voltage $V_{BE22}$ is substantially constant; for silicon transistors it is about 0.7 volts. Therefore, D.C. voltage $V_C$ of the output signal can be set constant in spite of amplitude level fluctuations of the IF signal from IF amplifier 10.

The collector potential of transistor 22, however, varies in accordance with the amplitude level fluctuations of the IF signal so that the varying collector potential of transistor 22 may be applied in feedback relationship to AGC transistor 32.

Figure 6:
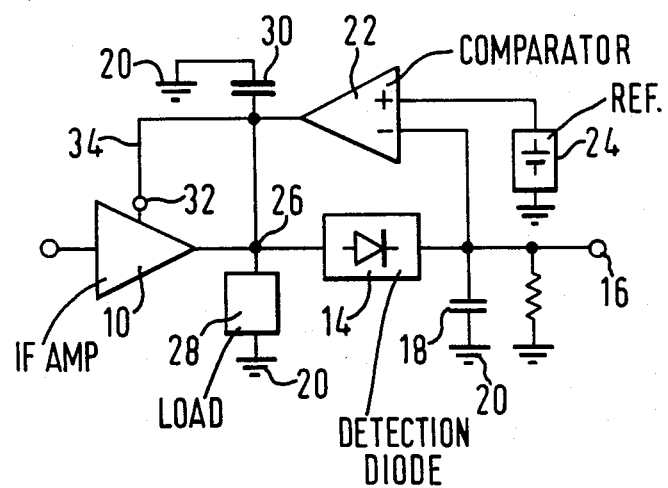
FIG. 6 shows a block diagram of another embodiment according to the present invention.

Referring now to FIG. 6, there is shown a block diagram of a modification of the AM detector. This embodiment differs from that of FIG. 3 in that an output of D.C. voltage comparator 22 is directly applied to connection node 26.

What is claimed is:

1. An amplitude modulation detector having a constant D.C. output voltage, for detecting the audio component of an AM signal, comprising:
    AM detection means responsive to first and second input signals for maintaining said constant D.C. output voltage regardless of level changes in said AM signal, said first signal being the AM signal;
    a D.C. reference voltage; and
    feedback means connected to the output of said detection means for comparing said D.C. output voltage of said detection means with said D.C. reference voltage to produce said second sigal, said feedback means including a D.C. voltage comparator supplied with said D.C. reference voltage and said constant D.C. output voltage being regulated to a value signal to said D.C. reference voltage by said feedback means.

2. The detector of claim 1 wherein said AM detection means is an envelope detector.

3. The detector of claim 1 wherein said feedback means further includes a load circuit.

4. The detector of claim 1 wherein said AM detection means is a diode and said first and second input signal are impressed on an inut of said diode.

* * * * *